United States Patent
Parthasarathy et al.

(10) Patent No.: US 9,685,243 B2
(45) Date of Patent: Jun. 20, 2017

(54) DETERMINING SOFT DATA FROM A HARD READ

(71) Applicant: Micron Technology, Inc., Boise, ID (US)

(72) Inventors: Sivagnanam Parthasarathy, Carlsbad, CA (US); Patrick R. Khayat, San Diego, CA (US); Mustafa N. Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/231,349

(22) Filed: Aug. 8, 2016

(65) Prior Publication Data

US 2016/0351275 A1 Dec. 1, 2016

Related U.S. Application Data

(60) Continuation of application No. 14/940,935, filed on Nov. 13, 2015, now Pat. No. 9,412,472, which is a division of application No. 13/691,266, filed on Nov. 30, 2012, now Pat. No. 9,190,174.

(51) Int. Cl.
*G11C 16/26* (2006.01)
*G11C 29/52* (2006.01)
*G11C 11/56* (2006.01)
*G11C 16/34* (2006.01)
*G06F 11/10* (2006.01)
*G11C 29/04* (2006.01)

(52) U.S. Cl.
CPC .......... *G11C 29/52* (2013.01); *G06F 11/1072* (2013.01); *G11C 11/5642* (2013.01); *G11C 16/26* (2013.01); *G11C 16/349* (2013.01); *G11C 16/3454* (2013.01); *G11C 2029/0411* (2013.01)

(58) Field of Classification Search
CPC ...................................................... G11C 29/52
USPC ...................................................... 365/185.03
See application file for complete search history.

(56) References Cited

U.S. PATENT DOCUMENTS

| | | |
|---|---|---|
| 7,502,254 B2 | 3/2009 | Murin et al. |
| 7,814,401 B2 | 10/2010 | Alrod et al. |
| 8,059,763 B1 | 11/2011 | Varnica et al. |
| 8,125,826 B2 | 2/2012 | Radke |
| 8,166,379 B1 | 4/2012 | Wu et al. |
| 8,243,511 B2 | 8/2012 | Patapoutian et al. |
| 8,392,809 B1 * | 3/2013 | Varnica ................. H03M 13/09 365/185.03 |
| 8,479,083 B2 * | 7/2013 | Chae .................... G11C 11/5642 714/721 |
| 8,625,347 B2 | 1/2014 | Sakurada |
| 9,437,320 B1 * | 9/2016 | Nguyen ............... G11C 16/349 |

(Continued)

OTHER PUBLICATIONS

Lou, et al., "Increasing Storage Capacity in Multilevel Memory Cells by Means of Communications and Signal Processing Techniques," Abstract 1 pg., Aug. 2000, vol. 147, Issue 4, Circuits, Devices and Systems, IEE Proceedings.

*Primary Examiner* — Son Mai
(74) *Attorney, Agent, or Firm* — Brooks, Cameron & Huebsch, PLLC

(57) ABSTRACT

Apparatuses and methods involving the determination of soft data from hard reads are provided. One example method can include determining, using a hard read, a state of a memory cell. Soft data is determined based, at least partially, on the determined state.

20 Claims, 7 Drawing Sheets

(56) References Cited

U.S. PATENT DOCUMENTS

| | | |
|---|---|---|
| 9,454,414 B2 * | 9/2016 | Micheloni .............. G06F 11/00 |
| 2010/0034018 A1 | 2/2010 | Yang et al. |
| 2011/0093652 A1 | 4/2011 | Sharon et al. |
| 2011/0167305 A1 | 7/2011 | Haratsch et al. |
| 2011/0209031 A1 | 8/2011 | Kim et al. |
| 2011/0214029 A1 | 9/2011 | Steiner et al. |
| 2011/0246855 A1 | 10/2011 | Cheng et al. |
| 2011/0246859 A1 | 10/2011 | Haratsch et al. |
| 2012/0163085 A1 * | 6/2012 | Alrod ................. G06F 11/1072 |
| | | 365/185.18 |

* cited by examiner

DETERMINING SOFT DATA FROM A HARD READ

PRIORITY INFORMATION

This application is a Continuation of U.S. application Ser. No. 14/940,935, filed Nov. 13, 2015, which issues as U.S. Pat. No. 9,412,472 on Aug. 9, 2016, which is a Divisional of U.S. application Ser. No. 13/691,266, filed Nov. 30, 2012, which issued as U.S. Pat. No. 9,190,174 on Nov. 17, 2015, the contents of which are included herein by reference.

TECHNICAL FIELD

The present disclosure relates generally to memory error correction, and more particularly, to apparatuses and methods for determining soft data from a hard read.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory, e.g., NAND flash memory and/or NOR flash memory, and/or can include volatile memory, e.g., DRAM and/or SRAM, among various other types of non-volatile and volatile memory. Flash memory devices can include memory cells storing information in a charge storage structure such as a floating gate, for instance, and may be utilized as non-volatile memory for a wide range of electronic applications. Flash memory devices typically use a one-transistor memory cell that allows for high memory densities, high reliability, and low power consumption.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory cells in an array architecture can be programmed to a desired state. For instance, electric charge can be placed on or removed from the charge storage structure, e.g., floating gate, of a memory cell to program the cell to a particular state. For example, a single level (memory) cell (SLC) can be programmed to one of two different states, each representing a different date value, e.g., a 1 or 0. Some flash memory cells can be programmed to one of more than two states corresponding to particular data values, each state representing a different data value, e.g., 1111, 0111, 0011, 1011, 1001, 0001, 0101, 1101, 1100, 0100, 0000, 1000, 1010, 0010, 0110, or 1110. Such cells may be referred to as multi state memory cells, multiunit cells, or multilevel (memory) cells (MLCs). MLCs can provide higher density memories without increasing the number of memory cells since each cell can store more than one digit, e.g., more than one bit of data.

A hard read is an operation to determine hard information, such as by comparing the threshold voltage of a memory cell, e.g., flash memory cell, to reference voltages delineating ranges of voltages corresponding to particular states. Soft data can be data other than the determination that a memory cell is, for example, charged to within a particular voltage level range, e.g., corresponding to a particular state. For example, a soft read can be used to more precisely determine the actual voltage level (within a finer granularity than the hard read) to which a memory cell is charged, so as to enable evaluating the voltage level with respect to voltage level range boundaries. In this manner soft data can indicate (or be used to indicate) a confidence level associated with the hard data. Error-correcting code schemes can perform much better via use of soft data. However, a soft read can be time consuming, and therefore can impact memory throughput.

DETAILED DESCRIPTION

Figure 1:
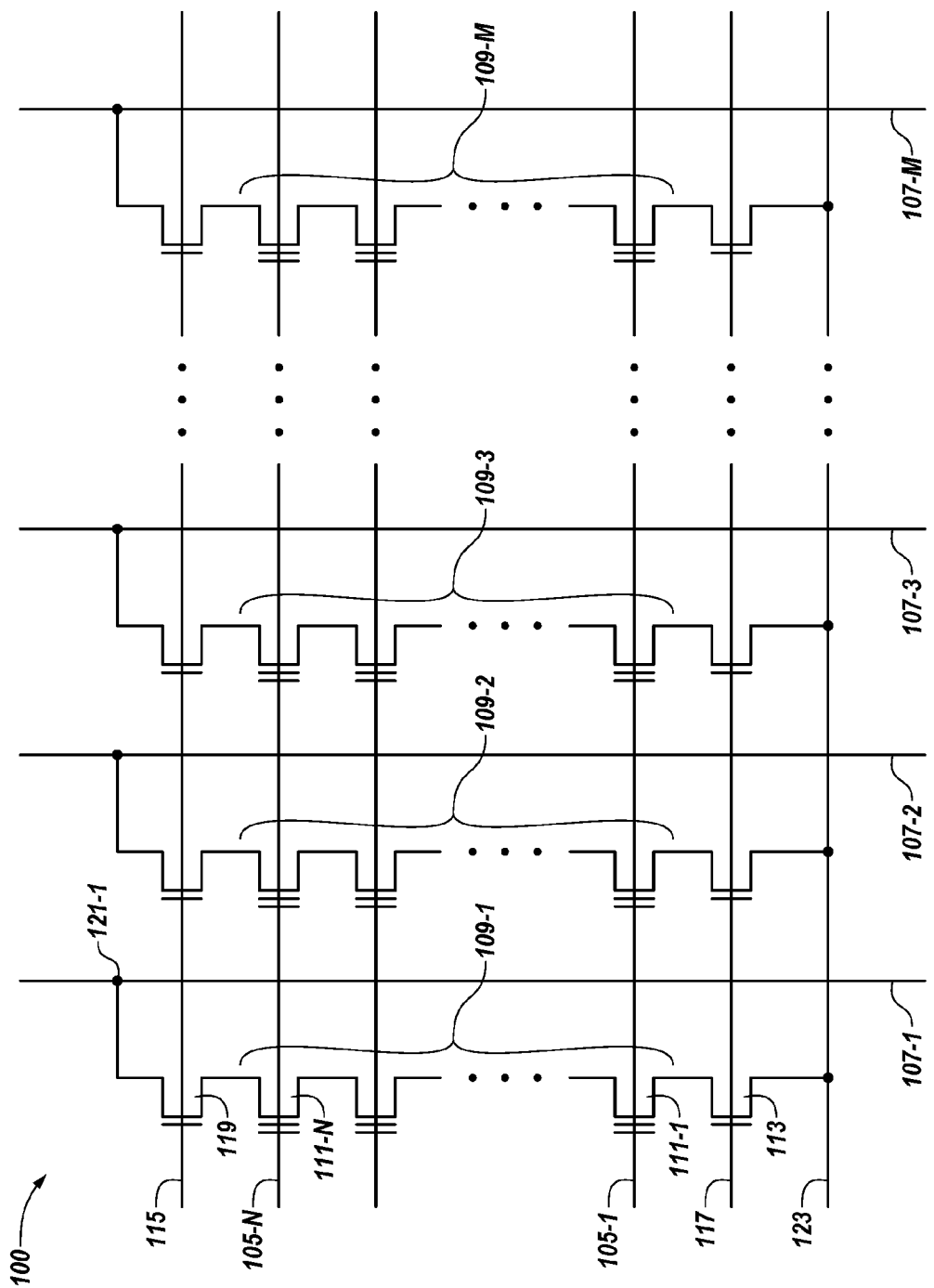
FIG. 1 illustrates a schematic diagram of a portion of a non-volatile memory array in accordance with a number of embodiments of the present disclosure.

Apparatuses and methods involving the determination of soft data from a hard read are provided. One example method can include determining, using a hard read, a state of a memory cell. Soft data is determined based, at least partially, on the determined state.

One way of increasing the capacity of memory devices is to store more than one bit of data per memory cell. If a memory cell can store multiple bits of data per memory cell, the capacity of the memory cell is likewise multiplied. It is possible to store more than one bit of data per memory cell in certain types of memory, such as Flash memory. Storing multiple bits of data per memory cell can also reduce the per unit storage capacity cost of a memory. However, storing multiple bits of data per memory cell does involve additional complexity.

For memory cells based on charge storage, such as Flash memory cells, the operative threshold voltage range of a memory cell can be the same for single level (memory) cell (SLC) or multiple level (memory) cell (MLC) devices. Therefore, increasing the number of states per cell increases the effect of noise on distinguishing between particular states. As a result, advanced error correction codes (ECC) schemes can be warranted to deal with higher raw bit error rates (RBERs) that can be associated with an increased number of states per memory cell. Advanced ECC schemes, such as low-density parity-check (LDPC) codes, can provide significantly stronger error-correction capability over BCH codes, for example. However, such advanced ECC schemes work more effectively with use of soft data, e.g., soft information.

Soft data can be beneficial in reading memory cells because the soft data can be used to account for changes in threshold voltage (Vt) distributions that correspond to various states of memory cells, e.g., shifts in the threshold voltage distributions corresponding to a particular data value. States, threshold voltages, and corresponding data values are discussed in more detail below as an introduction to the discussion regarding determining soft data from a hard read.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators "M" and "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 600 in FIG. 6. Elements shown in the various embodiments herein can be added, exchanged, and/or eliminated so as to provide a number of additional embodiments of the present disclosure. In addition, the proportion and the relative scale of the elements provided in the figures are intended to illustrate the embodiments of the present disclosure, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array, e.g., NAND Flash. However, embodiments described herein are not limited to this example. As shown in FIG. 1, memory array 100 includes access lines, e.g., word lines 105-1, . . . , 105-N, and intersecting data lines, e.g., local bit lines, 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET), 113, and a drain select gate (SGD), e.g., FET, 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In a number of embodiments, construction of non-volatile memory cells 111-1, . . . , 111-N includes a source, a drain, a charge storage structure such as a floating gate, and a control gate. Non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

Subsets of cells coupled to a selected word line, e.g., 105-1, ..., 105-N, can be programmed and/or read together as a page of memory cells. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target, e.g., desired, state, e.g., charge storage state.

A read operation (as used herein, a "read" operation can refer to a program verify operation) can include sensing a voltage and/or current change of a bit line coupled to a selected cell in order to determine the data value of the selected cell. The read operation can include pre-charging a bit line and sensing the discharge when a selected cell begins to conduct. As used herein, sensing is an act involved in reading.

Determining, e.g., sensing, the state of a selected cell can include providing a number of sensing signals, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing signal applied to the selected word line. For example, the state of a selected cell can be determined by the word line voltage at which the bit line current reaches a particular reference current associated with a particular state.

In a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

As an example, the memory cells of an array, such as array 100 shown in FIG. 1, can be single level (memory) cells (SLCs) or multi-level (memory) cells (MLCs). SLCs can be single-bit, e.g., two-state, memory cells. That is, the cells can be programmed to one of two states, e.g., P0 and P1, respectively. In operation, a number of memory cells, such as in a selected block, can be programmed such that they have a Vt level corresponding to either P0 or P1. As an example, state P0 can represent a stored data value such as binary "1". State P1 can represent a stored data value such as binary "0."

MLCs can be two-bit, e.g., four-state, memory cells, or store more than two bits of data per memory cell, including fractional bits of data per memory cell. For example, a two-bit memory cell can be programmed to one of four states, e.g., P0, P1, P2, and P3, respectively. In operation, a number of memory cells, such as in a selected block, can be programmed such that they have a Vt level corresponding to either P0, P1, P2, or P3. As an example, state P0 can represent a stored data value such as binary "11". State P1 can represent a stored data value such as binary "10". State P2 can represent a stored data value such as binary "00". State P3 can represent a stored data value such as binary "01". However, embodiments are not limited to these data value correspondence.

FIGS. 2A-2D are diagrams illustrating a number of threshold voltage distributions corresponding to states associated with memory cells programmed in accordance with a number of embodiments of the present disclosure. The memory cells associated with FIGS. 2A-2D can be memory cells such as cells 111-1, ..., 111-N described in connection with FIG. 1.

Figure 2A:
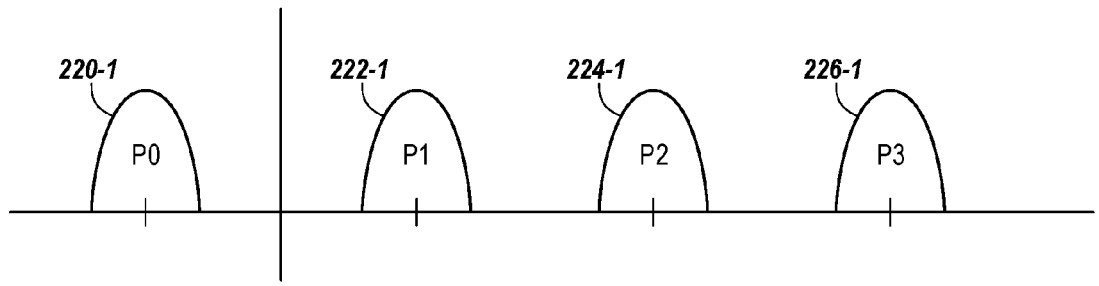
FIGS. 2A-2C illustrates one embodiment of a table for the programming sequence of a two-bit NAND non-volatile memory array according to the present disclosure.
Figure 2B:
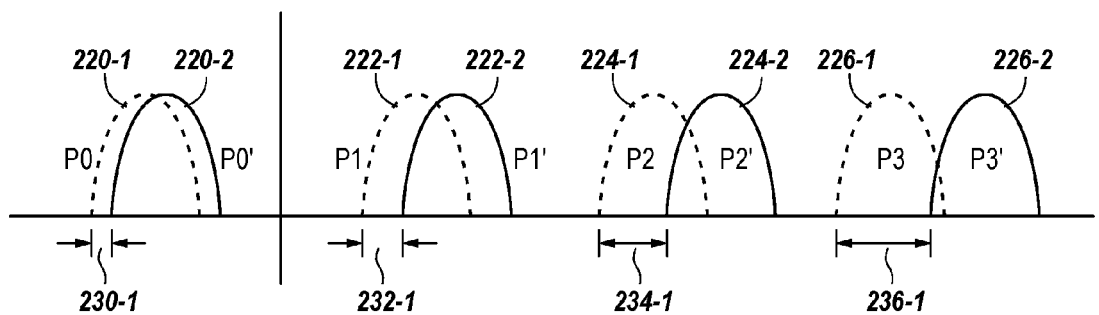
Figure 2C:
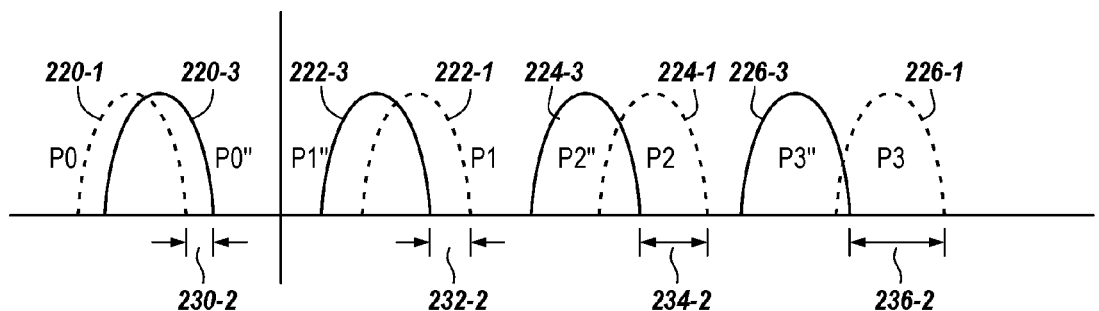

FIGS. 2A-2C illustrates one embodiment of a table for the programming sequence of a two-bit NAND non-volatile memory array according to the present disclosure. The memory cells associated with FIGS. 2A-2C are two-bit, e.g., four-state, MLCs. However, embodiments of the present disclosure are not limited to this example.

The Vt distributions 220-1, 222-1, 224-1, and 226-1 of FIG. 2A correspond to a number of memory cells programmed to one of four states, e.g., P0, P1, P2, or P3. The Vt distributions 220-2, 222-2, 224-2, and 226-2 of FIG. 2B can correspond to the number of memory cells associated with FIG. 2A after a number of cycling operations, e.g., program/erase cycles, have shifted the Vt distributions. The Vt distributions 220-3, 222-3, 224-3, and 226-3 of FIG. 2C can correspond to the number of memory cells associated with FIG. 2A after the Vt distributions have shifted due to the memory cells remaining static, e.g., the memory cells haven't been programmed or erased for a period of time.

In FIG. 2A, threshold voltage distributions 220-1, 222-1, 224-1, and 226-1 correspond to a number of memory cells that are initially programmed to a first, a second, a third, or a fourth state, e.g., P0, P1, P2, or P3. In a number of embodiments, additional programming and/or erasing of the number of memory cells can cause the threshold voltages for memory cells at the four states to change as illustrated in FIG. 2B by threshold voltage distributions 220-2, 222-2, 224-2, and 226-2.

For example, memory cells programmed to the first state are illustrated by the P0' threshold distribution 220-2 and the threshold voltage distribution has shifted by an amount indicated by shift 230-1, memory cells programmed to the second state are illustrated by the P1' threshold distribution 222-2 and the threshold voltage distribution has shifted by an amount indicated by shift 232-1, memory cells programmed to the third state are illustrated by the P2' threshold distribution 224-2 and the threshold voltage distribution has shifted by an amount indicated by shift 234-1, and memory cells programmed to the fourth state are illustrated by the P3' threshold distribution 226-2 and the threshold voltage distribution has shifted by an amount indicated by shift 236-1. In a number of embodiments, threshold distributions corresponding to states closer to an erased state, such as P0, can shift less than threshold distributions corresponding to states that are further from the erased state. The shifts in the threshold distributions 230-1, 232-1, 234-1, and 236-1 can be caused by additional program and/or erase cycles performed on the number of memory cells.

In a number of embodiments, memory cells remaining static can cause the threshold voltages of the memory cells to change as illustrated in FIG. 2C by threshold voltage distributions 220-3, 222-3, 224-3, and 226-3. The memory cells can lose charge over time when the memory cells remain static causing the threshold voltage of the memory cells to shift towards 0 volts.

For example, memory cells programmed to the first state are illustrated by the P0" threshold distribution 220-3 and the threshold voltage distribution has shifted by an amount indicated by shift 230-2, memory cells programmed to the second state are illustrated by the P1" threshold voltage distribution 222-3 and the threshold voltage distribution has shifted by an amount indicated by shift 232-2, memory cells programmed to the third state are illustrated by the P2"

threshold voltage distribution 224-3 and the threshold voltage distribution has shifted by an amount indicated by shift 234-2, and memory cells programmed to the fourth state are illustrated by the P3" threshold voltage distribution 226-3 and the threshold voltage distribution has shifted by an amount indicated by shift 236-2. The shifts in the threshold voltage distributions 230-2, 232-2, 234-2, and 236-2 can be caused by charge loss in the memory cells that do not have program and/or erase cycles performed on them over a period of time.

As can be observed in comparing the various shifted threshold distributions in FIGS. 2B and 2C with the threshold voltage distributions 220-1, 222-1, 224-1, and 226-1 shown in FIG. 2A, threshold voltage distributions can shift in one or more directions. Threshold voltage distributions can also change by expanding and/or contracting. The amount and manner in which threshold voltage distributions can change are not limited to those changes shown in FIGS. 2B and 2C. Consequently, threshold voltage distributions can approach one another, and can even overlap, such that the threshold voltage distributions for adjacent states (which are sometimes referred to herein as "neighboring states") can intersect. As such, adjacent states, and the data values they represent, can be relevant in accurately determining a data value stored by a memory cell.

Figure 2D:
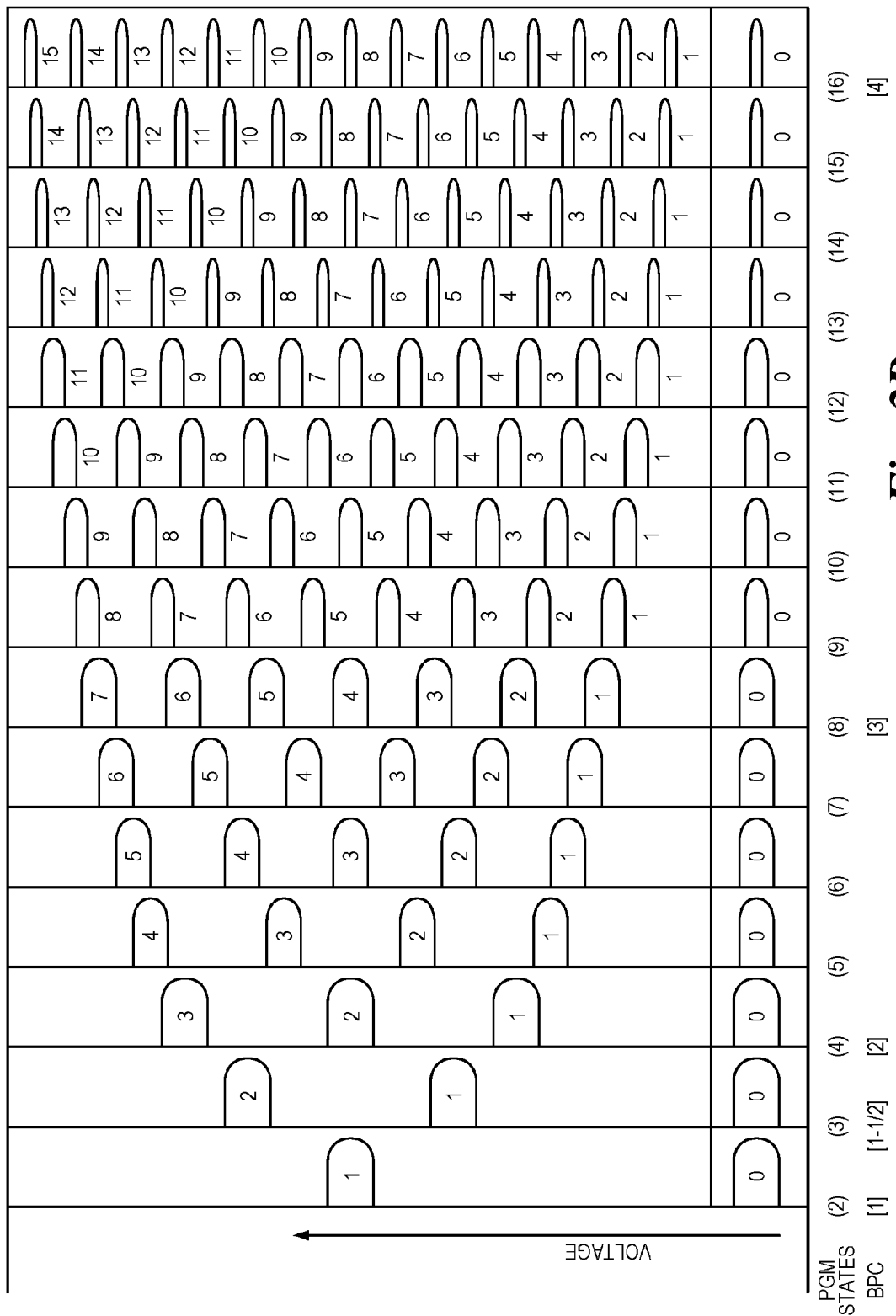
FIG. 2D is a diagram illustrating examples of different numbers of states to which memory cells can be programmed in accordance with a number of embodiments of the present disclosure.

FIG. 2D is a diagram illustrating examples of different numbers of states to which a memory cell can be programmed in accordance with a number of embodiments of the present disclosure. The memory cells can be NAND flash memory cells as described above and can be programmed to various Vt levels, e.g., within a voltage range of about −2V to +3V. However, embodiments of the present disclosure are not limited to a particular type of memory cell or to a particular operational voltage range. One can observe from FIG. 2D that as the quantity of states per memory cell increases, the voltage range comprising a particular state decreases, and/or the separation between states decreases. Therefore, shifting of Vt levels can become more problematic as the quantity of states per memory cell increases.

The quantity of states (PGM STATES) to which a memory cell may be programmed is indicated below the diagram, and the quantity of digits, e.g., bits, of data per (memory) cell (BPC) corresponding to the quantity of states is shown for certain quantities of states. The states shown in FIG. 2D are labeled 2, 3, 4, etc., with each state corresponding to a respective distribution of Vt levels within the operative threshold voltage range. The lowermost state, e.g., a state corresponding to lowermost Vt levels, may be referred to as an erase state. For example, a memory cell can be left in, or "soft" programmed to, a lowermost state after an erase operation.

The number of bits of data that can be stored by a memory cell can be determined using the formula $\log_2(L)$, where L is the number of states to which the memory cell is programmable. Memory cells programmable to a power of 2 quantity of states, e.g., 2 states, 4 states, 8 states, etc., can individually store an integer number, N, of bits of data per memory cell.

For example, a memory cell that can be programmed to one of two different states, e.g., 0 or 1, can store one digit, e.g., bit, of data, e.g., 0 or 1. A memory cell that can be programmed to one of four different states, e.g., 0, 1, 2, or 3, can store two digits, e.g., bits, of data, e.g., 00, 01, 10, or 11. A memory cell that can be programmed to one of eight different states, e.g., 0-7, can store three digits, e.g., bits, of data, e.g., 000, 001, 010, 011, 100, 101, 110, or 111.

Memory cells that are programmable to a non-power-of-2 quantity of states, e.g., 3 states, 5 states, etc., can store a non-integer number of bits of data per memory cell, e.g., fractional number of bits of data per memory cell. Memory cells that are programmable to a non-power-of-2 quantity of states can be used in combination with other memory cell(s) to store an integer number of bits of data. That is, rather than each individual cell storing an integer number of bits of data (N) per memory cell, combinations of the memory cells store an integer number (N) of bits of data.

For instance, two memory cells that can each be programmed to one of three different states, e.g., 0, 1, or 2, can be said to store 1½ digits of data per memory cell, and can, in combination, store three digits of data, e.g., 000, 001, 010, 011, 100, 101, 110, or 111. A memory cell that can be programmed to one of five different states, e.g., 0 to 4, can be combined with three other such memory cells to store 9 bits of data, e.g., 000000000, 000000001, 000000010, etc. In general, for a group of cells collectively storing an integer number (N) of digits of data, but individually storing a fractional number of digits of data, $2^N$ different N digit data values are mapped to a corresponding number, e.g., $2^N$, of different state combinations of the group. Determining soft data from a hard read can be implemented involving memory cells having capability to store whole and/or fractional bits of data per memory cell. Memory cells that are programmable to a non-power-of-2 quantity of states are discussed further below with respect to FIG. 3C.

Figure 3A:
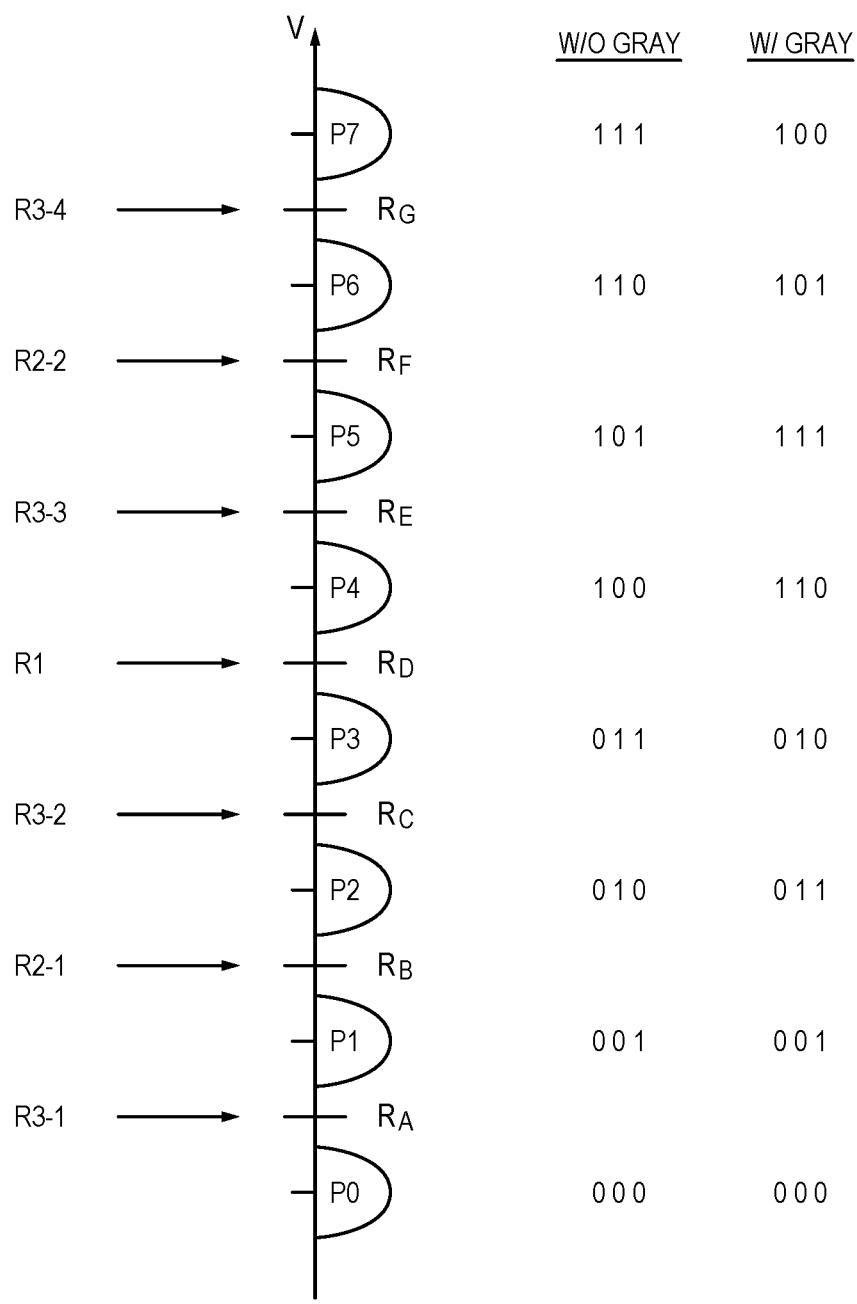
FIG. 3A illustrates a diagram of states and sensing magnitudes for a multilevel memory cell in accordance with a number of embodiments of the present disclosure.

FIG. 3A illustrates a diagram of states and sensing magnitudes for an MLC in accordance with a number of embodiments of the present disclosure. The example shown in FIG. 3A can represent, for example, memory cells 111-1, . . . , 111-N previously described in connection with FIG. 1. FIG. 3A is used to describe hard reads. FIG. 3A shows eight states, e.g., P0, P1, P2, P3, P4, P5, P6, and P7 for a 3 bits/cell MLC. A 3 bits/cell MLC can be programmed such that it has a state corresponding to one of the P0, P1, P2, P3, P4, P5, P6, or P7 shown in FIG. 3A. For instance, state P0 can represent a stored data value such as "000." The data values that might be represented by each respective state are shown in FIG. 3A for data value arrangements with, and without, Gray coding. Data value arrangements without Gray coding can have successive values in binary value order, as shown in FIG. 3A. Data value arrangements with Gray coding are such that two successive values differ in only one bit. However, embodiments of the present disclosure are not limited to the two particular data values arrangements associated with each respective state shown in FIG. 3A.

A number of hard read sensing signal magnitudes, e.g., $R_A$, $R_B$, $R_C$, $R_D$, $R_E$, $R_F$, and $R_G$, can be used to determine the state of a memory cell, which can be associated with an amount of charge stored in the memory cell. A hard read of a memory cell can include applying a sensing signal of a particular voltage level, e.g., hard read sensing signal, to the memory cell, with a sensing determination made with respect to the applied particular voltage level. If the memory cell conducts in response to the applied hard read sensing signal, then the state of the memory cell may correspond to a threshold voltage of the memory cell being equal to or less than the magnitude of the applied hard read sensing signal. A sequence of individual hard read sensing signal magnitudes may be used to narrow the state down to be one of the possible multiple states per memory cell. The sequence of hard read sensing signals can, at least in one embodiment, comprise a ramping signal, e.g., where the ramped signal sequentially steps through each of the magnitudes.

For example with respect to FIG. 3A, if application of the first sensing signal magnitude, R1, (corresponding to read sensing signal magnitude $R_D$) causes the memory cell to conduct, then the state of the memory cell is one of P0, P1, P2, or P3. If application of the first sensing signal magnitude, R1, does not cause the memory cell to conduct, then the state of the memory cell is one of P4, P5, P6, or P7. By choosing the first sensing signal magnitude, R1, to correspond to read sensing signal magnitude $R_D$, which is between the four lower states and the four upper states, the sensing signal of a first hard read can eliminate a portion of the possible states, e.g., half of the states in this example. Once narrowed to either the four lower states or the four upper states, an appropriate second hard read sensing signal, e.g., R2-1 (corresponding to sensing signal magnitude $R_B$) or R2-2 (corresponding to sensing signal magnitude $R_F$), can be used to further narrow the state to a group of two possible states.

Thereafter, an appropriate third hard read sensing signal, e.g., R3-1 (corresponding to sensing signal magnitude $R_A$), R3-2 (corresponding to sensing signal magnitude $R_C$), R3-3 (corresponding to sensing signal magnitude $R_E$), or R3-4 (corresponding to sensing signal magnitude $R_G$), can be used to distinguish the actual state of the memory cell between the remaining two possible states. In this manner, the particular one of 8 possible states can be determined using three hard read sensing signals. The hard sensing read signals can alternatively be a ramped sensing signal, e.g., sequentially stepping from one sensing signal magnitude to another such as that described with respect to FIG. 3B.

Figure 3B:
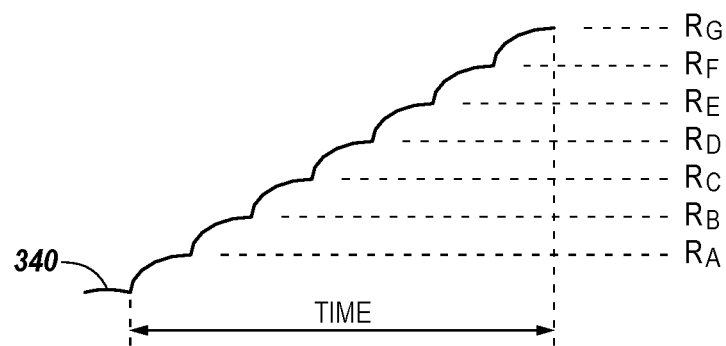
FIG. 3B illustrates a diagram of a sensing signal for a multilevel memory cell in accordance with a number of embodiments of the present disclosure.

FIG. 3B illustrates a diagram of a sensing signal for a multilevel memory cell in accordance with a number of embodiments of the present disclosure. In contrast to a hard read, e.g., application of three discrete hard read sensing signals, a soft read can be used to determine the state of a memory cell and/or additional soft data. According to some embodiments, a soft read can vary an applied sensing signal across a voltage range to determine additional information about the condition of the memory cell, such as the particular voltage to which the memory cell is programmed. That is, the applied sensing signal can be increased through a number of magnitudes, e.g., R1, R2, R3, R4, R5, R6, and R7, for the three-bit memory cell discussed with respect to FIG. 3A. The sensing operation can proceed by increasing the magnitude of the sensing signal through the number of magnitudes serially in sequence, e.g., from R1 to R2, . . . to R7, as shown by the curve of applied sensing signal magnitude 340 verses time shown in FIG. 3B. By increasing the magnitude of the sensing signal from R1 through R7, the particular state, e.g., P0, P1, P2, P3, P4, P5, P6, or P7 shown in FIG. 3A, of the memory cell can be determined.

Performing a soft read can provide more information than simply just the state of the memory cell, as described above. That is, the read can provide additional soft data as compared to the hard read, such as an indication of where within a particular state the memory cell is charged. Determining whether the memory cell is programmed near the center, or near a boundary, of a particular programmed state can be an indication of the probability that the determined state is the state the memory cell was programmed to (or a different state due to some error introduction mechanism). However as illustrated, the time required to perform such a soft read operation may be relatively long as compared to a hard read operation described with respect to FIG. 3A. The present inventors appreciated that determining soft data at the speed of a hard read would be beneficial. Additionally, determining soft data from a hard read avoids having to communicate additional data, e.g., voltage magnitudes, during a read to the controller.

Figure 6:
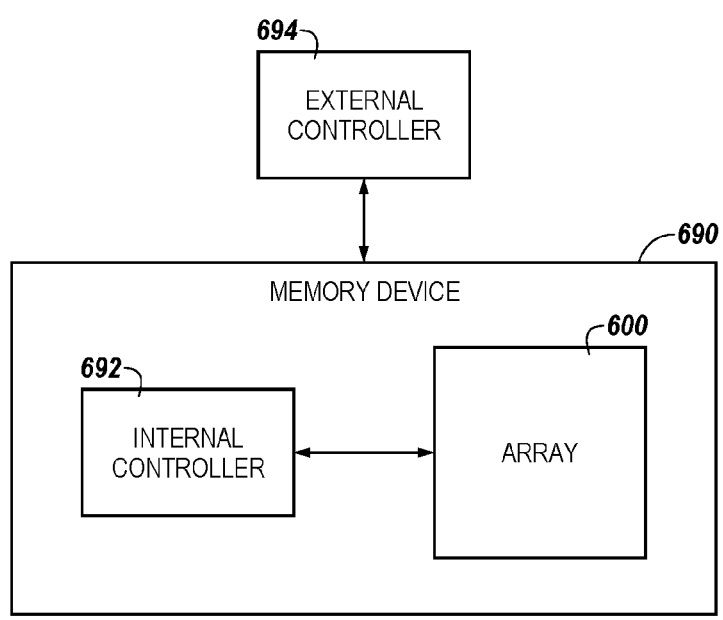
FIG. 6 illustrates a block diagram of an apparatus in the form of a memory device in accordance with a number of embodiments of the present disclosure.

Transferring soft data, e.g., from a memory device to an external controller, e.g., FIG. 6 at 694, or from and array of a memory device to an internal controller, e.g., FIG. 6 at 692, can involve a throughput penalty, e.g., in transferring the soft data as well as the hard information, e.g., the sensed state. For example, consider transferring 4 bits of soft data for each memory cell of a memory device using 4 bits/cell (BPC) memory cells. In transferring 16 bits of data from the memory device, only 8 hard bits of data are transferred, the remaining 8 bits of data comprising the soft information. As such, the throughput hit is 100% in this example, e.g., twice as much information is communicated. Operating a memory device in a mode where only hard information is transferred as much as possible can increase the speed of a memory device.

According to a number of embodiments, a ramped sensing signal may be used as described above with respect to FIG. 3B; however, all of the soft data may not be determined, e.g., captured, and/or transferred, so as to avoid the throughput and/or bandwidth costs of such transfers, e.g., to a controller. For a number of embodiments, the memory cells may be sensed with a soft read, but soft data transferred to the controller may be different, e.g., less than all. In a number of embodiments, the soft read may step through the ramping signal with less granularity than might be used for a traditional soft read or a soft read in which soft data is captured and/or transferred.

Figure 3C:
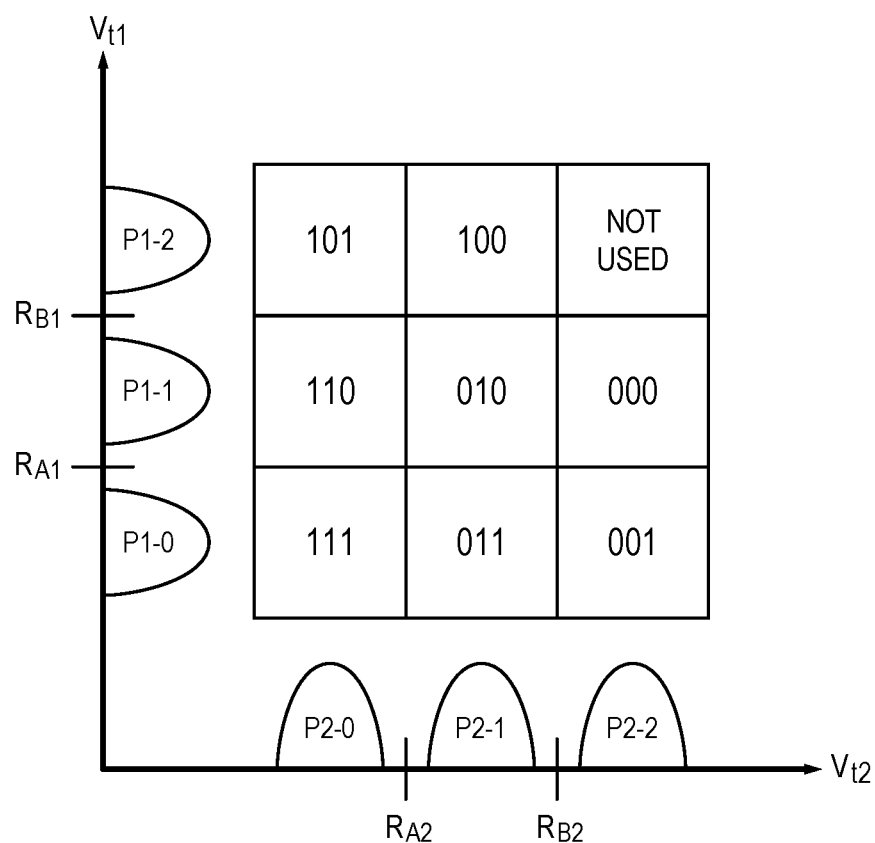
FIG. 3C illustrates a diagram of a number of states and data values corresponding to fractional bits of data per memory cell configurations in accordance with a number of embodiments of the present disclosure.

FIG. 3C illustrates a diagram of a number of states and data values corresponding to fractional bits of data per memory cell configurations in accordance with a number of embodiments of the present disclosure. The example shown in FIG. 3C can represent, for example, memory cells 111-1, . . . , 111-N previously described in connection with FIG. 1. The example shown in FIG. 3C represents two 1½ bit, e.g., three-state, memory cells. That is, two memory cells are used in combination to store 3 bits of data. As such 3 bits divided by 2 memory cells equates to 1½ bits/cell. To achieve storage of 3 bits of data, eight states are needed since there are eight possible combinations of 3 bit data values.

Therefore, each memory cell can be programmed to one of three possible states for a total of 9 possible combinations between the two memory cells. However, in at least some embodiments, only 8 of the 9 possible combinations of states between the two memory cells are used. One example association between state combinations and data values for 3 bits is shown in FIG. 3C. However, embodiments of the present disclosure are not limited to fractional bits of data per memory cell configurations illustrated by this example of 1½ bit memory cells, and can include various other fractional bit memory cells, e.g., 2¼ bit/cell, 3⅛ bit/cell, etc. Also, embodiments of the present disclosure are not limited to the particular correspondence between state combinations and associated data values shown in FIG. 3C, and other associations therebetween are possible.

In the example illustrated in FIG. 3C, the three states P1-0, P1-1, and P1-2, to which a first of the two 1½ bit memory cells can be programmed are shown on the vertical axis, e.g., y-axis, and the three states P2-0, P2-1, and P2-2 to which a second of the two 1½ bit memory cells can be programmed are shown on the horizontal, e.g., x-axis. A number of (hard) read voltages are shown for each memory cell, e.g., $R_{A1}$ and $R_{B1}$ for the first memory cell, and $R_{A2}$ and $R_{B2}$ for the second memory cell. A particular combination of states and corresponding data value can be determined by at most two hard reads. It is possible in some instances to determine a particular state of a memory cell by the first hard read.

A particular data value can be determined by determining the states for each of the two memory cells. For example, the combination of the first state for the first memory cell, e.g., P1-0, and the first state for the second memory cell, e.g., P2-0, can correspond to the data value 111, e.g., a hard data value of 111 can be output responsive to a read request.

Figure 4A:
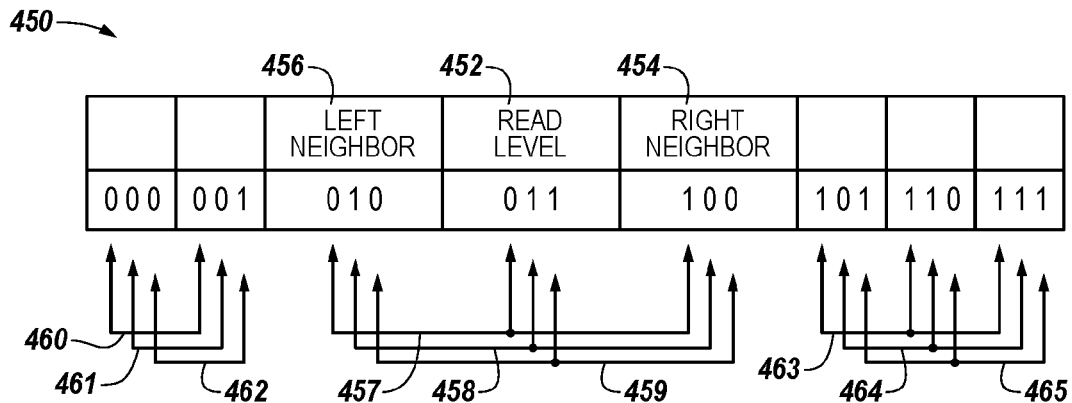
FIG. 4A illustrates a data value arrangement without Gray coding for a memory cell capable of storing 3 bits of data per memory cell in accordance with a number of embodiments of the present disclosure.

FIG. 4A illustrates a data value arrangement 450 without Gray coding for a memory cell capable of storing 3 bits of data per memory cell in accordance with a number of embodiments of the present disclosure. The arrangement shown in FIG. 4A is the same data value arrangement without Gray coding that was discussed with respect to FIG. 3A. For MLC memory devices, the majority of read errors are single state errors, e.g., single level errors. Single state errors can cause a small number of errors among the bits of data represented by the state. Where the data value arrangement utilizes Gray coding, a single state error corresponds to a single bit error.

Decoding advanced error-correction codes (ECCs), such as low-density parity-check (LDPC) codes, can be accomplished using soft data such as log-likelihood ratio (LLR) information. Confidence about a binary data value decision can be expressed as an LLR, which is calculated as $$LLR = \log\left(\frac{P(0)}{P(1)}\right),$$

where P(0) is a conditional probability that a digit of a data value, e.g., a bit, has a first value, e.g., zero, and P(1) is a conditional probability that a digit of a data value has a second value, e.g., one. (Note that if code words are stored in memory, the data value actually stored in memory is that of the code word, e.g., LDPC code bits.) When full confidence is attributed to a sensed state the above formula results in positive infinity when a state representing a '0' is sensed since $$LLR = \log\left(\frac{1}{0}\right) = \log(\infty) = \infty,$$

and negative infinity when a state representing a "1" is sensed since $$LLR = \log\left(\frac{0}{1}\right) = \log(0) = -\infty.$$

The measure of confidence can be truncated to one bit, returning +1 in place of positive infinity and returning −1 in place of negative infinity responsive to a read request, for example.

A hard read is an operation to determine hard information such as by comparing the threshold voltage of a memory cell, e.g., flash memory cell, to reference voltages delineating ranges of voltages corresponding to particular states. A hard read can be full-confidence sensing, e.g., sensing that does not involve other information about the digits of the data value such as confidence. That is, the data value sensed from the memory cell is assumed to be the data value that was programmed to the memory. For full-confidence sensing, a digit of a data value that is sensed, e.g., read from memory, as a "0" will have a corresponding LLR of +1, and a data value that is sensed as a "1" can have a corresponding LLR of −1.

Soft data, e.g., LLRs, determined by an assumption of full confidence that the read, e.g., hard read, has accurately determined the state to which the memory cell was programmed may be less accurate than soft data determined from a hard read by comparison of the digits at positions in the data value of the determined state to the digits at the same positions in the data value corresponding to neighboring states, as provided by the present disclosure.

Soft data can accompany the hard information, which can be an indicator of the sensed state, e.g., the data value corresponding to the sensed state. For example, a soft read can more precisely determine the actual voltage, e.g., within a sub-range, to which a memory cell is charged, rather than just determining to which state the memory cell is charged. Having a more precise measure of the voltage to which a memory cell is charged can provide information as to where within a voltage range the memory cell is charged, which can impact the confidence that the state was determined correctly. For example, if the actual voltage to which the memory cell is charged is determined to be near a boundary between adjacent voltage ranges, the confidence associated with the state determination may be smaller than if the actual voltage to which the memory cell is charged is determined to be near the center of a voltage range.

According to embodiments of the present disclosure, soft data can be determined by techniques other than a soft read of the memory cell. The soft data can reflect a certain measure of doubt about the data value that can be considered along with the sensed data value. Along with sensing the data value, a probability that a particular digit if the sensed data value is a zero and a probability that the particular digit of the sensed data value is a one can be used to compute an LLR associated with the sensed digit value.

For example, a digit of a data value may have a 75% probability of actually being a zero value and a 25% probability of actually being a one value. Therefore, the associated LLR can be calculated to be:

$$LLR = \log\left(\frac{.75}{.25}\right) = 0.4771$$

A hard read is a preferred mode of sensing memory for throughput reasons, since it avoids the computational load and delay to consider probabilities for each state and compute an associated LLR for each sensed bit. However, according to a number embodiments of the present disclosure LLR soft data can be determined, e.g., computed, derived, generated, etc., from a hard read.

According to a number of embodiments of the present disclosure, probabilities can be pre-determined for each digit of a data value, e.g., bit, corresponding to each state in a particular data value arrangement based on the data values corresponding to neighboring states in the particular data value arrangement. From these pre-determined probabilities, LLRs can also be computed for each digit of a data value, e.g., bit, corresponding to each state in a particular data value arrangement based on the data values corresponding to neighboring states in the particular data value arrangement. The data value probabilities and/or LLRs can be stored in a data structure, such as a look-up table (LUT). Thereafter, appropriate data value probabilities and/or LLRs can be retrieved from the LUT based on, e.g., indexed by, a hard read.

The data value arrangement 450 shown in FIG. 4A indicates a current read state 452, e.g., the state to which data value 011 corresponds. The right neighbor state 454 is shown to correspond to data value 100, and the left neighbor state 456 is shown to correspond to data value 010. The current read state 452 corresponds to a state determined for the memory cell after sensing the memory cell and determining, for example, that the voltage of the memory cell was within the range of the state 452. Without any soft data, it is unknown where within the voltage range corresponding to the current read state 452 the memory cell is charged. For example, the memory cell may have a threshold voltage that is close to one of the boundaries between the current read state 452 and either the right neighbor state 454 or left neighbor state 456.

That is, a slight change in the threshold voltage to which a memory cell was programmed where the threshold voltage is near a boundary between two states can result in reading a different state, and determining a different data value, than was originally programmed in the memory cell. (A slight change in the threshold voltage that is not near the boundary between states likely will not cause an error in data value.) However, if the data values of the neighboring states are considered with respect to the data value of the current read state 452, it can be observed that errors in some data values are more likely, and some are less likely. More particularly, if the digits at each position in data values of the neighboring states are considered with respect to the digit at each position in the data value of the current read state 452, it can be observed that errors in some digits of the data value of the current read state 452 are more likely, and some are less likely. From this, soft data such as the confidence of respective digit values, can be determined.

For example, considering the most significant bits (MSBs) 457, e.g., left-most bits, of the data value represented by with MSB of the current read state 452, e.g., 0, the right neighbor state 454, e.g., 1, and the left neighbor state 456, e.g., 0, it can be observed that an inadvertent shift of a memory cell programmed to state 452 into the right neighbor state 454 would result in a change in the value of the MSB, thus leading to an error, but a shift of a memory cell programmed to the 452 state into the left neighbor state 456 would not result in a change in the value of the MSB. Since the MSBs of the data values represented by 2 of the 3 area states, e.g., current read state 452, the right neighbor state 454, and the left neighbor state 456, are 0's, the probability of the MSB of the data value actually being a 0 when the current read state 452 is sensed might be set to ⅔, e.g., 0.67, for example. Conversely, the probability of the MSB of the data value actually being a 1 when the current read state 452 is sensed might be set to ⅓, e.g., 0.33, since the value of the MSB of the data value represented by 1 of the three area states is a 1. Embodiments of the present disclosure are not limited to the numerical probabilities used here in example, and other methods and reasoning can be used when assessing probability of various bits having a particular value.

From these example probabilities a LLR can be computed for this example:

$$LLR = \log\left(\frac{.67}{.33}\right) = 0.301$$

(or 0.6931 if working in a natural log domain)

This LLR, computed based on the data value arrangement 450, can be associated with the MSB of the 011 data value as soft data. Similarly, probabilities can be determined, and LLRs computed, for each bit of each data value corresponding to each state of the data value arrangement 450. When a particular state in a particular data value arrangement 450 is sensed, the probability and/or LLR soft data associated with each bit of the associated data value can be retrieved from a LUT in which it is stored. As such, soft data can be determined from only a hard read.

Likewise, the center bit (CB) 458 of the data value for the current read state 452 has a different value for one neighbor, and a same value for the other neighbor. The least significant bit (LSB) of the data value for the current read state 452 has a different value for both neighbor states than that associated with the data value corresponding to the current read state 452. According to some embodiments, if storing probabilities and not LLRs in an LUT, a level error rate (LER) can be stored, which can be used to compute probabilities for neighboring states and will naturally weigh the current state higher. The probabilities for these bits of the 011 data value can be determined by some other scheme, such as more heavily weighting the values of the bits corresponding to the current read state 452. For example, the values of bits of data values corresponding to neighboring states may each only be weighted 25% and the values of bits of data values corresponding to the current read state 452 may be weighted 50% in determining the probability of a particular bit of a particular data value having a particular value for a particular data value arrangement.

The probabilities and/or LLRs can be determined for digits of data values corresponding to other states in the data value arrangement. For example, the state to which the data value 110 corresponds has a right neighbor state to which the data value 111 corresponds, and a left neighbor state to which the data value 101 corresponds. The MSB 463 of the data value 110 is a 1, as are the MSBs of the data values represented by both neighboring states. Therefore, the probability of the MSB of the data value 110 actually being a 1 might be 100% and the probability of the MSB of the data value 110 actually being a 0 might be 0%. That is, because the value of the MSBs in both of the data values represented by the neighboring states is a 1, an error in the MSB when the state to which the data value 110 corresponds is determined is small. The CB 464 and LSB 465 of the data value 110 are similarly situated to digits of data values previously described with respect to the current read state 452.

States located at either end of a particular data value arrangement only have one neighboring state, since there is no state on one side. However, probabilities, from which LLRs can be computed, can still be determined with respect to the single neighboring state. For example, the MSB 460 and the CB 461 of the data value 000 are the same as the MSB 460 and CB 461 of the single neighboring state, e.g., the state to which the data value 001 corresponds. Therefore, the probability of the MSB actually being a 0 value might be determined as 100% when the state to which the data value 000 corresponds is sensed, and the probability of the MSB actually being a 1 value might be determined as 0%.

However, the probability of the LSB 462 of the data value 000 actually being a 0 value might be determined as a first percentage, and the probability of the LSB 462 actually being a 1 value might be determined as a second percentage, when the state to which the data value 000 corresponds is sensed because the LSB 462 of the data value represented by the neighboring state (001) has a 1 value. According to various embodiments, probabilities associated with the currently read state being accurate, e.g., first percentage, can be set higher than probabilities associated with a state neighboring the currently read state being accurate, e.g., second percentage.

Alternatively, the probabilities can be weighted in a different manner, as appropriate. Weightings can be based, for example, on other factors such as on the condition of the memory cells of a memory device, e.g., the number of program/erase (P/E) cycles, the amount of time the data has been retained, the number of read disturbs, etc. For instance, depending on the condition of the memory, e.g., the length of data retention and/or the number of read disturbs, one of digits of the data value are more likely to be in error than another. Accordingly, probabilities of errors for digits of a sensed data value can be appropriately weighted to reflect the differing likelihood of error.

For example, given certain data retention, there can be a higher probability of losing the charge stored in the floating gate of a Flash memory cell and therefore the threshold distributions tend to shift towards the erase state, as discussed with respect to FIG. 2B. This makes it more likely that a memory cell programmed to a particular state will be sensed as being in a left neighbor state to the particular state (in the arrangement shown in FIG. 4A). Given a high number of read disturbs, there is a higher probability of adding charge to the floating gate. This shifts the threshold voltage distributions towards the highest state, as discussed with respect to FIG. 2C. This makes it more likely that a memory cell programmed to a particular state will be sensed as being in a right neighbor state to the particular state (in the arrangement shown in FIG. 4A). Therefore, the current condition(s) of the memory can be also be used as an indicator of the probability of a digit of a data value to be in error, and the respective LLRs computed according to the methods of the present disclosure based on data values of neighboring states can be refined accordingly.

According to a number of embodiments of the present disclosure, a simplified method can be implemented for determining soft data from a hard read based on the particular data value arrangement, as discussed above. Each digit of the data value represented by the currently read state can be compared with digits at the same position in data values represented by neighbor states, e.g., states to the left and/or right in a particular data value arrangement. For example, a MSB of the data value corresponding to the currently read state can be compared with the MSB of the data value corresponding to the left neighbor state and/or the MSB of the data value corresponding to the right neighbor state.

Based on the above bit-to-bit comparisons and/or condition of a memory cell, e.g., program/erase cycles, retention, etc., the LLR for each bit of the data value corresponding to the determined state of the memory cell can be determined as follows:

If the value of a bit at a particular position in the respective data values corresponding to the three area states, e.g., left, current, and right, are in agreement, e.g., is the same, then determine a highest LLR value, e.g., LLR(1).

If the value of a bit at a particular position in the data value corresponding to the currently read state is in agreement with, e.g., is the same as, the value of a bit at the same position in a data value corresponding to only one of the neighbor states, then determine a smaller LLR value than LLR(1), e.g., LLR (2).

If the value of a bit at a particular position in the data value corresponding to the currently read state is in disagreement with, e.g., is different than, the values of bits at the same position of data values corresponding to the left and right neighbor states, then determine a smaller LLR value than LLR(2), e.g., LLR(3).

According to a number of embodiments, the determined LLR values, e.g., LLR(1), LLR(2), and LLR(3), can correspond to a magnitude of the computed LLRs, and so are positive. The determined LLR values, e.g., LLR(1), LLR(2), and LLR(3), can have the appropriate sign based on the hard read.

The above relative LLR values can be extended to more bits of data per state data value arrangements than was described in the example above. Although the above conditions address a currently read state that has two neighboring states, depending on the data value corresponding to respective states, all possibilities may not be used in every application.

Also, the LLRs determined for bits of data values corresponding to states at ends of a particular data value arrangement can be different from the LLRs determined for bits of data values corresponding to states that have two neighboring states. Also, the LLRs determined for bits of the data value corresponding to a state at one end of a particular data value arrangement, e.g., the erase state, can be different from the LLRs determined for bits of the data value corresponding to the state at the opposite end of the particular data value arrangement. According to a number of embodiments with respect to a state at an end of the particular data value arrangement, a LLR can be determined for each bit in the data value corresponding to the state of the memory cell as follows:

If the values of digits at a particular position in data values corresponding to the two adjacent states, e.g., current and neighbor, are in agreement, e.g., are the same, then determine a highest end state LLR value, e.g., LLR (E1).

If the values of digits at a particular position in data values corresponding to two adjacent states are in disagreement, e.g., are different, then determine a smaller end state LLR value than LLR(E1), e.g., LLR (E2).

The end state LLR values can be the same, or different, than the LLR values determined for states having two neighboring states. According to some embodiments, the determined LLR values, e.g., LLR(E1) and LLR(E2), are positive since they correspond to a magnitude of the computed LLRs, and can have the appropriate sign based on the hard read.

The comparisons between states and/or LLR value computations can be accomplished before or after a sensing operation involving a particular memory cell. For example, LLR values corresponding to a particular data value arrangement can be stored in a LUT and retrieved following a sensing operation involving a particular memory cell.

According to a number of embodiments of the present disclosure, as a default, a null LLR value, e.g., LLR(0), can be determined from a hard read to determine a state without comparison of the digits at positions in the data value of the determined state to the digits at the same positions in the data value corresponding to each of the neighboring states. The relative LLR values among the derived LLRs can be set as follows: LLR(1)>LLR(0)>LLR(2)>LLR(3). According to some embodiments, the determined LLR value, e.g., LLR(0) is positive, corresponding to a magnitude of the computed LLR, and can have the appropriate sign based on the hard read. For example, null LLR value, e.g., LLR(0), can be determined as discussed previously for full confidence sensing. The null LLR value may be affected by a setting on the controller, or upon other conditions that make comparison of the digits at positions in the data value of the determined state to the digits at the same positions in the data value corresponding to neighboring states inefficient and/or impossible.

The above-described method for determining soft data using a hard read can be implemented for individual bits of data values corresponding to an identified determined state. However, various memory device sensing modes do not read all bits of a data value corresponding to a particular state and/or do not determine a single state in order to determine a value of a particular digit of a data value. For example, with respect to a 3 bits of data per memory cell (abbreviated BPC herein) memory configuration, e.g., shown with respect to FIG. 3A without Gray coding, reading the lower page of a given memory cell can be accomplished in a single read that returns a value of a single MSB bit without having to determine an individual state. Similarly, reading the middle page can be accomplished with two reads to return the values of two bits, e.g., MSB and CB. For both of these operations, a single state is not determined and all 3 bits are not determined. Instead, a group of possible states are determined for the memory cell.

For reads that segregate groups of states from one another, the method described above with respect to individual states, can be implemented with respect to digits of data values that can be determined based on groups of states. The LLRs are digit specific. Therefore, as some (but not all) digits of a data value are determined from determination that the state of the memory cell is one of a particular group of states, soft data, e.g., LLR, can be determined for the digits of the data value as soon as they are determined, e.g., before all the digits of the data value are determined. Thereafter, the soft data, e.g., LLR, can be refined, as the group of data states that include the determined data state contains fewer states.

The LLRs can be refined as the group of states are refined through additional reads. For instance, an LLR for a digit of a data value can be computed according to the methods of the present disclosure after sensing a lower page that can determine some, e.g., one, but not all digits of the corresponding data value. LLRs for other digits of the data value can be computed as the other digits are determined, such as after sensing additional page(s), e.g., middle, upper. Also, the LLRs for previously-determined digit(s), e.g., the digit determined after sensing the lower page, can also be adjusted as the group of states including the particular state also includes fewer possible other states. For example, an LLR for one digit can be computed after reading a lower page to determine one digit of a data value. An LLR for a second digit can be computed after reading a middle page to determine the second digit of the data value, and the LRR for the first digit can optionally be adjusted, if appropriate, since more may be known about the values of digits at a same position in the data value after reading the middle page and reducing the quantity of states in the group of states. Finally, an LLR for a third digit of the data value can be computed after reading an upper page to determine the third digit of the data value, and the LLRs for the first and second digits can optionally be adjusted, if appropriate once the particular singular sensed state of the memory cell is determined.

For example, again with reference to FIG. 3A, a first read, e.g., R1 to determine a value of the MSB of the data value stored in a memory cell, can be approached as was described for an end state where the "end state" is a group of states, e.g., those above $R_D$ and those below $R_D$. Since the MSB of the data value corresponding to the determined group of states does not agree with the MSB of the data value corresponding to the other group of states, a relatively smaller LLR, e.g., smaller than if the bit between two groups of states agreed, can be determined for the MSB (even if only temporarily).

A second read (to determine the value of the CB) further segregates the possible states into two groups in which the center bit does not agree between neighboring groups of states. Therefore, the relatively lower LLR can be determined for the CB. However, the second read may add more certainty to the previous MSB determination if the second read determines that the memory cell in one of the end two states. For example, assume the first read at $R_1$ determines the MSB is 1 indicating that the state of the memory cell is above $R_D$, and is therefore one of states P4-P7.

Further assume the second read, at R2-2, determines that the CB is also 1 indicating that the state of the memory cell is above $R_F$, and is therefore one of states P6-P7. The second read adds additional certainty to the MSB determination since the MSB of the data value corresponding to the group of states P6-P7 is now in agreement with the MSB of its neighboring group of states P4-P5, so the LLR determined for the MSB can be refined to reflect the additional certainty. However, if the second read, at R2-2, determines that the CB is 0 indicating that the state of the memory cell is below $R_F$, and is therefore one of states P4-P5, no additional certainty is added to the original MSB determination, and the previously determined LLR can remain unchanged.

According to a number of embodiments, determining soft data by comparing bits of the data value corresponding to the currently read state to bits of the data values corresponding to neighboring states can also be used to refine, e.g., adjust, modify, LLRs determined by a soft read. Soft reads were discussed with respect to FIG. 3B. For example, a soft read may determine a state and provide additional soft data, including an initially-determined LLR. Comparison of the digits at positions in the data value of the determined state to the digits at the same positions in the data value corresponding to the neighboring states may then be used to refine the initially-determined LLR. The initially-determined LLR may be determined, for example, based on the particular voltage to which the memory cell is charged, and then refined based on the comparison of the digits at positions in the data value of the determined state to the digits at the same positions in the data value corresponding to the neighboring states.

Figure 4B:
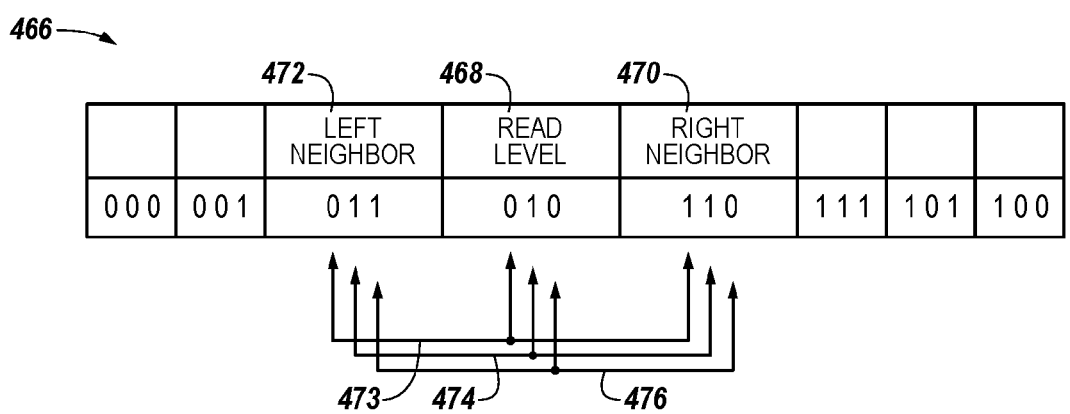
FIG. 4B illustrates a data value arrangement with Gray coding for a memory cell capable of storing 3 bits of data per memory cell in accordance with a number of embodiments of the present disclosure.

FIG. 4B illustrates a data value arrangement 466 with Gray coding for a memory cell capable of storing 3 bits of data per memory cell in accordance with a number of embodiments of the present disclosure. The data value corresponding to the current read state 468 is shown being different than the data value corresponding to the same state in the data value arrangement 450 without Gray coding shown in FIG. 4A, as are the data values for the right neighbor state 470, and the left neighbor state 472. In a data value arrangement with Gray coding, the value of only one bit changes between adjacent states. However, a similar analysis can be made to pre-determine probabilities for each individual digit, e.g., bit, of a data value corresponding to a state based on the data values corresponding to neighboring states in the particular data value arrangement. From these pre-determined probabilities, LLRs can also be computed for each digit of the data values corresponding to the state based on the data values corresponding to the neighboring states in the particular data value arrangement.

With respect to the MSB 473 comparison, the MSB of the data value corresponding to current read state 468 is in agreement with the MSB of the data value of only one of the neighboring states. Therefore, the LLR determined for the MSB of the current read state 468 can be set to LLR(2), e.g., relative to the other LLRs. The LSB 476 of the data value corresponding to current read state 468 is also only in agreement with the LSB of the data value of only one of the neighboring states. Again, the LLR determined for the LSB of the current read state 468 can be set to LLR(2), e.g., relative to the other LLRs. The center bit (CB) 474 of the data value corresponding to current read state 468 is in agreement with the CB of the data values of the neighboring states, so that the LLR determined for the CB of the current read state 468 can be set to LLR(1) indicating a relatively small chance that the determined value of the CB is in error.

The method for deriving soft data from a hard read described with respect to the data value arrangement examples illustrated in FIGS. 4A and 4B can be generalized for wider applicability as follows. With respect to memory cells having an integer, i.e., non-fractional, number of digits/cell, e.g., bits/cell, the following one dimensional approach can be used to determine the probabilities used to compute a respective associated LLR for each digit in a memory cell:
1. Determine the probability of the read threshold voltage, $V_t$, given each of the $N_L$ states in the cell, $V_L$:

$$Pr(V_t | V_L) \text{ for } L=0:N_L-1$$

The index L refers to "level," used herein interchangeably with a state. This is the Probability Mass Function (PMF) for the given memory cell. This step can be accomplished based on a predetermined arrangement of data values corresponding to states.
2. Determine the confidence measure, e.g., LLR, for each digit as the log of the ratio of the sum of the conditional probabilities with the $b^{th}$ bit of level L being 0 versus 1:

$$LLR_b = \log \frac{\sum_{L \in L_b=0} Pr(V_t | V_L)}{\sum_{L \in L_b=1} Pr(V_t | V_L)}$$

In this manner, LLRs can be determined based on the $V_t$ belonging to each of the possible states, e.g., levels. Since a level error is typically limited to a nearest neighbor, determining the probability of a threshold voltage, $V_t$, can be simplified where only the current state, e.g., level, and its nearest neighbor probabilities are used.

Depending on the condition of the memory cells of a memory device, e.g., the number of program/erase (P/E) cycles, the amount of time the data has been retained, the number of read disturbs, etc., the state, e.g., level, error rate, P(e), can vary. Since the most likely error will occur involving an adjacent state, the probability of the sensed state can be set as 1-2P(e) and the probability of each adjacent state can be set to P(e). For hard reads, register fields can be used to indicate the following:

TABLE 1

P(e) Definition for Neighbors

| Definition | Description |
| --- | --- |
| Ln(P(e)) | Probability of level error P(e) |
| Ln(1 − P(e)) | (1 − Probability of level error) |
| Ln(2P(e)) | Probability of 2 * level error |
| Ln(1 − 2P(e)) | (1 − 2 * probability of level error) |

"Neighbor" refer to a state, e.g. level, adjacent a particular state, such as a state adjacent a sensed state.

Memory cells having 4 digits/memory cell, e.g., bits per cell (BPC) are considered in this example; however, embodiments of the present disclosure are not so limited. Input to the method for determining soft data from a hard read of the present disclosure can be a state (level), L(C), sensed by a hard read. The left neighboring state can be denoted L(L), and the right neighboring state can be denoted L(R). The binary digit encoding vector for the three levels, e.g. current, left, right, can be denoted by X(C), X(L), and X(R) respectively.

LLRs can be determined for the example 4 BPC in the probability domain, as shown in Table 2 below.

TABLE 2

Derived LLR Example for 4BPC

| | Left | Current | Right |
| --- | --- | --- | --- |
| State (Level) | 0 | 1 | 2 |
| Bit Map X:x[3:0] | 0000 | 0001 | 0011 |
| Probability | P(e) | (1 − 2P(e)) | P(e) |

| | LLR (X == 0001) | | | |
| --- | --- | --- | --- | --- |
| | x(3) | x(2) | x(1) | x(0) |
| Pr(x(i) == 0) | 1 | 1 | (1 − P(e)) | P(e) |
| Pr(x(i) == 1) | 0 | 0 | P(e) | (1 − P(e)) |
| LLR(x(i)) | +MAX | +MAX | Ln[(1 − P(e))/P(e)] | Ln[P(e)/(1 − P(e))] |

This scheme can be extended to other integer BPC configurations as well. According to an example implementation, the soft data is LLRs having values determined in the (natural) log domain. However, embodiments of the present disclosure are not so limited, and LLR values can be determined in other domains.

In the event there is no left or right neighbor state, as will be the case when the current state is at one end or the other of the memory cell programming voltage range, the terms (1-P(e)) and P(e) can be used, and the left or right neighbor can be disallowed, as appropriate. The determination thereafter is straightforward. The determined LLRs can be further scaled, e.g., scaled down, for example, such as to skew the LLRs to reflect factors influencing confidence in particular data values and/or so as to be more/less conservative.

Fractional BPC memory cells capable of storing 2.5 BPC are considered in the following example, each having 6 states per memory cell. Two such memory cells, in combination, are capable of storing 5 digits, e.g., bits of data. Not all of them might be legal mapping. For a 2.5 BPC case, in 2 cells there are 6×6=36 possible combinations out of which only $2^5$=32 are valid. Embodiments of the present disclosure are not so limited, and can be implemented for other fractional BPC memory cell configurations. Extending the approach discussed above for memory cells having integer BPC, each memory cell can have 3 probabilities corresponding to the memory cell actually being programmed to the current state or to one of the two neighboring states. Therefore, the two cells (with three state possibilities/cell) have $3^2$=9 probabilities to consider. Not all of the 9 possible combinations may be used to uniquely represent a respective data value, e.g., in some embodiments, some of the possible combinations will not be valid. Table 3 is for a 2.5 BPC example with 6 states per memory cell. However, since level errors are typically single level errors, e.g., different by one state, computations can be limited to 3 out of the 6 states, e.g., the current state and the states neighboring the current state.

TABLE 3

2.5 BPC Cells

|  | Cell[1] | | Cell[0] | |
| --- | --- | --- | --- | --- |
|  | Pr | Level | Pr | Level |
| Left | P(e) | L(1, L) | P(e) | L(0, L) |
| Current | (1 − 2P(e)) | L(1, C) | (1 − 2P(e)) | L(0, C) |
| Right | P(e) | L(1, R) | P(e) | L(0, R) |

The 9 state possibilities are enumerated in Table 4 below:

TABLE 4

2.5 BPC Enumeration

| SI | Cell[1] | L(1, i) | Cell[0] | L(0, i) | Valid | DUP 2p5(L(1, i), L(0, i)) |
| --- | --- | --- | --- | --- | --- | --- |
| 0 | P(e) | L(1, L) | P(e) | L(0, L) | isValid_2p5 (L(1, i), L(0, i)) | X(0) |
| 1 | P(e) | L(1, L) | (1 − 2P(e)) | L(0, C) | | X(1) |
| 2 | P(e) | L(1, L) | P(e) | L(0, R) | | X(2) |
| 3 | (1 − 2P(e)) | L(1, C) | P(e) | L(0, L) | | X(3) |
| 4 | (1 − 2P(e)) | L(1, C) | (1 − 2P(e)) | L(0, C) | | X(4) |
| 5 | (1 − 2P(e)) | L(1, C) | P(e) | L(0, R) | | X(5) |
| 6 | P(e) | L(1, R) | P(e) | L(0, L) | | X(6) |
| 7 | P(e) | L(1, R) | (1 − 2P(e)) | L(0, C) | | X(7) |
| 8 | P(e) | L(1, R) | P(e) | L(0, R) | | X(8) |

The two functions are defined as follows:
  isValid_2p5(L(1,i), L(0,i): returns a Boolean if the mapping is valid
  DUP2p5(L(1,i), L(0,i)): computes the bit map x[4:0]
The individual LLRs, e.g., for particular digits of data values corresponding to particular states, can be determined as was done for the integer BPC configuration discussed above. This method can be extended for any data value arrangement with 2 cells, e.g., two dimensions, among other data value arrangements.

The two dimensional fractional BPC method for determining LLRs described above can be extended to fractional BPC memory cells in other configurations, e.g., 2/4/8 dimensions. As mentioned above, the majority of errors are single-state errors. Therefore, in at least one embodiment the most probable state and its nearest neighbors are used to determine the LLR. The nearest neighbors used are the states to the left and to the right of the current state in a one dimensional arrangement of states.

Therefore, for an N-dimensional data value arrangement, there are a total of $3^N$ states to consider in the LLR derivation. With 2-dimensions, e.g., 1.5, 2.5, 3.5 BPC, there are a total of $3^2=9$ possible states to consider. Since this number is pretty small, all 9 states can be considered and enumerated in a data structure when determining the LLR. In the case of 4-dimensions or 8-dimensions however, the number of possible states grows exponentially and creates a challenge to determining LLRs with enumeration in a data structure. With 4-dimensions, there are a total of $3^4=81$ possible states to consider. With 8-dimensions, there are a total of $3^8=6,561$ possible states to consider. In these cases, an approximated simplified approach can be easily deployed to determine the LLRs.

Figure 5:
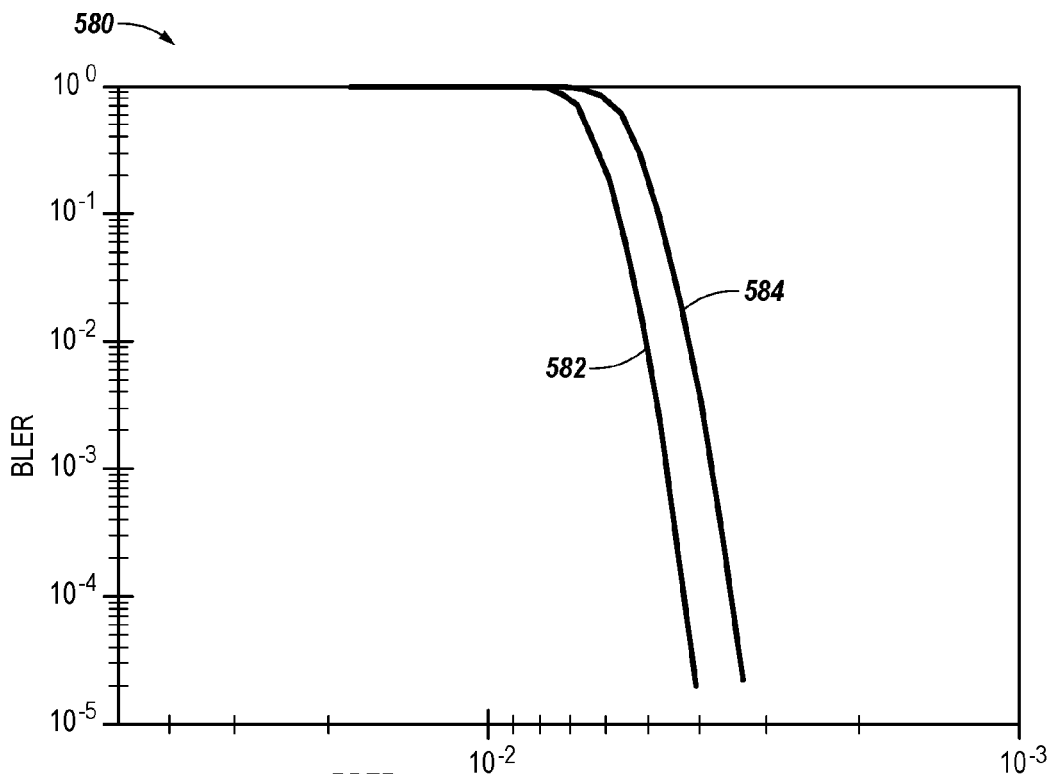
FIG. 5 is a graph illustrating block error rate (BLER) versus raw bit error rate (RBER) according to various approaches including at least one in accordance with a number of embodiments of the present disclosure.

FIG. 5 is a graph 580 illustrating block error rate (BLER) versus raw bit error rate (RBER) according to various approaches including at least one in accordance with a number of embodiments of the present disclosure. Plot 584 indicates a simulated example memory performance for a hard read with hard information, and plot 582 indicates a simulated example showing an error rate of a memory device using soft data with its error correction scheme, e.g., LLRs derived as described above with respect to FIG. 4A.

Graph 580 shows that the expected performance advantage associated with using soft data determined from a hard read according to the present disclosure where the determined LLRs are properly selected to deliver good performance. More particularly, the block error rate (BLER) performance improved in the range of more than 2 decades at a given flash raw bit error rate (RBER).

FIG. 6 illustrates a block diagram of an apparatus in the form of a memory device 690 in accordance with a number of embodiments of the present disclosure. As shown in FIG. 6, memory device 690 can include an internal controller 692 coupled to a memory array 600. Memory array 600 can be communicatively coupled to an external controller 694.

Memory array 600 can be, for example, memory array 100 previously described in connection with FIG. 1. Although one memory array is shown in FIG. 6, embodiments of the present disclosure are not so limited, e.g., memory device 690 can include more than one memory array coupled to internal controller 692.

Internal controller 692 and/or external controller 694 can include, for example, control circuitry and/or firmware. As an example, internal controller 692 and/or external controller 694 can support fractional bit per memory cell configurations. Internal controller 692 can be included on the same physical device, e.g., the same die, as memory array 600, or can be included on a separate physical device that is communicatively coupled to the physical device that includes memory array 600.

Internal controller 692 and/or external controller 694 can determine soft data associated with the memory cells in memory array 600 in accordance with a number of embodiments of the present disclosure. For example, internal controller 692 and/or external controller 694 can determine soft data associated with the states of a single memory cell, e.g., integer digits/memory cell, and/or at least two of the memory cells in memory array 600, e.g., fractional digits/memory cell, and determine soft data associated with the data value that corresponds to the combination of the states of the one or at least two memory cells based, at least in part, on the soft data associated with the states of the memory cell(s).

The embodiment illustrated in FIG. 6 can include additional circuitry that is not illustrated so as not to obscure embodiments of the present disclosure. For example, memory device 690 can include address circuitry to latch address signals provided over I/O connectors through I/O circuitry. Address signals can be received and decoded by a row decoder and a column decoder, to access memory array 600. As an additional example, memory device 690 can include sense circuitry.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells; and
a controller configured to:
determine, using a hard read, a state of a memory cell; and
determine soft data based, at least partially, on the determined state of the memory cell;
wherein the controller is configured to include a particular log-likelihood ratio (LLR) in the soft data in response to a first digit of the determined state having a same value as a second digit of a neighboring state in a same position as the first digit.

2. The apparatus of claim 1, wherein the controller is further configured to determine the state of the memory cell by determining which group of states the memory cell is currently in.

3. The apparatus of claim 1, wherein the controller is further configured to determine the state of the memory cell by determining which states a combination of memory cells are currently in.

4. The apparatus of claim 1, wherein the soft data is based, at least partially, on whether the first digit at a position in the data value corresponding to the determined state has the same value as the second digit at the same position in a data value corresponding to a neighboring state.

5. The apparatus of claim 4, wherein the controller is configured to more heavily weight the soft data corresponding to the value of the digit in the data value corresponding to the determined state than the soft data corresponding to the value of the digit in the data value corresponding to the neighboring state.

6. The apparatus of claim 1, wherein the controller is configured to base the soft data, at least partially, on digits at the same position in respective data values corresponding to neighboring states.

7. The apparatus of claim 6, wherein the controller is configured to base the soft data, at least partially, on whether the digits at the same position in the respective data values corresponding to the neighboring states have the same value as a digit at the same position in a data value corresponding to the determined state.

8. The apparatus of claim 7, wherein the controller is configured to include in the soft data an additional LLR in response to:
the digit at the same position in the data value corresponding to at least one of the neighboring states has the same value as the digit at the position in the data value corresponding to the determined state; and
the digit at the same position in the data value corresponding to at least one of the neighboring states does not have the same value as the digit at the position in the data value corresponding to the determined state.

9. An apparatus, comprising:
an array of memory cells; and
a controller configured to:
determine a data value corresponding to a sensed state of a memory cell;
compare a first digit of the determined data value to a second digit at a same position in each of data values of states neighboring the sensed state; and
compute a log-likelihood ratio (LLR) for the digit of the determined data value based on the comparison;
wherein the controller is configured to compute a relatively larger LLR in response to the first digit being in agreement with more than one of the second digits.

10. The apparatus of claim 9, wherein the controller is further configured to determine a sign of the LLR based on a hard read of the memory cell.

11. The apparatus of claim 9, wherein the controller is further configured to compute the LLR by determining soft data as a largest LLR for the digit in the determined data value being the same as all digits at a same position in the data value corresponding to the at least one neighboring state.

12. The apparatus of claim 11, wherein the controller is further configured to compute the LLR by determining soft data as an intermediate value LLR for the digit in the determined data value being the same as some but not all digits at the same position in the data value corresponding to the at least one neighboring state.

13. The apparatus of claim 12, wherein the controller is further configured to determine soft data as a smallest LLR for the digit in the determined data value being different than all digits at the same position in the data value corresponding to the at least one neighboring state.

14. An apparatus, comprising:
an array of memory cells; and
a controller configured to:
receive a data value sensed from a memory cell, wherein the data value corresponds to a sensed state of the memory cell; and
determine soft data from the data value, where the soft data is based, at least partially, on whether a first digit at a position in the data value has a same value as a second digit at a same position in the data value corresponding to a neighboring state of the sensed state;
wherein the controller is configured to include a particular log-likelihood ratio (LLR) in the soft data when the first digit has the same value as the second digit.

15. The apparatus of claim 14, wherein the controller is further configured to include:

an additional LLR in the soft data when the digit does not have the same value as the digit corresponding to the neighboring state; and wherein the particular LLR is different than the additional LLR.

16. The apparatus of claim 14, wherein the controller is further configured to determine soft data by retrieving the soft data from a data structure based, at least partially, on the determined state of the memory cell.

17. The apparatus of claim 16, wherein the controller is further configured to determine the soft data by retrieving the soft data from a look-up table.

18. The apparatus of claim 14, wherein the controller is further configured to receive the data value sensed from the memory cell by receiving only the sensed state of the memory cell via a hard read.

19. The apparatus of claim 14, wherein the controller is further configured to receive the data value sensed from the memory cell by receiving the sensed state of the memory cell and receiving sensed soft data with the sensed state.

20. The apparatus of claim 19, wherein the controller is further configured to determine soft data from the data value by adjusting the sensed soft data based, at least in part, on the determined soft data.

* * * * *